(12) United States Patent
Sanford et al.

(10) Patent No.: US 8,837,163 B2
(45) Date of Patent: Sep. 16, 2014

(54) INTEGRATED FLEX TAIL CIRCUIT PACKAGING

(75) Inventors: Emery A. Sanford, San Francisco, CA (US); Sean A. Mayo, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 201 days.

(21) Appl. No.: 13/337,822

(22) Filed: Dec. 27, 2011

(65) Prior Publication Data

US 2013/0163210 A1 Jun. 27, 2013

(51) Int. Cl.
*H05K 1/11* (2006.01)
*H05K 1/14* (2006.01)
*H05K 3/40* (2006.01)

(52) U.S. Cl.
CPC .............. *H05K 1/147* (2013.01); *H05K 3/4069* (2013.01)
USPC .......................................... 361/803; 174/260

(58) Field of Classification Search
CPC .............. H05K 1/02; H05K 1/14; H05K 3/30
USPC .......... 174/254, 258, 260, 521; 361/803, 760, 361/749; 257/782, 783, 784
See application file for complete search history.

(56) References Cited

U.S. PATENT DOCUMENTS

| | | | |
|---|---|---|---|
| 5,580,676 A | 12/1996 | Honda et al. | |
| 5,907,477 A * | 5/1999 | Tuttle et al. | 361/760 |
| 6,528,204 B1 * | 3/2003 | Hikmet et al. | 429/128 |
| 6,924,551 B2 * | 8/2005 | Rumer et al. | 257/688 |
| 7,288,340 B2 | 10/2007 | Iwamoto | |
| 7,356,923 B2 * | 4/2008 | Honer | 29/852 |
| 7,663,064 B2 | 2/2010 | Dutta et al. | |
| 8,536,462 B1 * | 9/2013 | Darveaux et al. | 174/260 |
| 8,557,629 B1 * | 10/2013 | Kim et al. | 438/106 |
| 2004/0227258 A1 * | 11/2004 | Nakatani | 257/787 |
| 2011/0215480 A1 | 9/2011 | Gorczyca et al. | |

FOREIGN PATENT DOCUMENTS

WO  WO2008/023199  2/2008

* cited by examiner

*Primary Examiner* — Yuriy Semenenko
(74) *Attorney, Agent, or Firm* — David C. Kellogg (57) ABSTRACT

An integrated structure for interconnection of electrical components is provided. In one embodiment, the integrated structure includes a through mold via (TMV) module having a substrate and at least one component coupled to the substrate. A flexible printed circuit board (flex-PCB) is integrated with the substrate of the TMV module. A TMV is provided through a body of the module to allow the flex-PCB to couple with a logic board.

14 Claims, 6 Drawing Sheets

INTEGRATED FLEX TAIL CIRCUIT PACKAGING

TECHNICAL FIELD

The present invention relates generally to three dimensional circuit topologies and, more particularly, to a structure that allows for circuit elements and a flexible printed circuit board interconnect to a main logic board to reside in the same area on a logic board.

BACKGROUND

In today's electronic devices, a variety of circuits and components typically reside on separate substrates. In particular, main logic boards ("MLBs") commonly include a rigid printed circuit board ("PCB") with major components such as processors, codecs, power management integrated circuits, and flash memory, among other things. Other system components such as displays, touchscreen, cameras, microphones, speakers and earpieces, antennas, external headphone and other connectors, battery, dome switches, daughter boards, and so forth, typically feed into the MLB via a polyimide flexible printed circuit board ("flex-PCB" or "flex"). The flex and MLB commonly are coupled together through one of a variety of interconnect methods inducting zero insertion force ("ZIF"), board-to-board ("B2B"), hand soldering, hot-bar soldering and anisotropic conductive film ("ACF"), for example. These interconnects consume a relatively large area on the surface of the MLB compared to other circuit elements, including passive components and integrated circuits ("ICs").

Previous work has been undertaken to explore 3D circuit topologies using through mold via (TMV) modules. Generally, a module is a subsystem or group of circuit elements that share a common substrate. For the present purpose, a collection of components (active and/or passive) is soldered to a module substrate. The module may be potted or encapsulated with a resin to insulate the module components from external contact and to provide a rigid structure to the module. TMVS are created by a variety of techniques including drilling a hole through the resin to contact exposed metal circuits on the module substrate and filling the hole with solder or plating it with a metal. Alternatively, tall metal structures are embedded during potting that contact the substrate circuits on one end and are flush with the external surface of the resin on the other. In either case, a structure is formed with internal components and metal interconnects on both the substrate bottom and the resin surface. Circuits can pass up through the TMVs to other systems using passthrough connections. However, connection of a module to a flex using conventional techniques method (e.g., B2B, hand solder, etc.) incurs a height penalty (e.g., increases the height of the module) and may render the technology unsuitable for particular designs.

SUMMARY

An integrated structure for interconnection of electrical components is provided. In one embodiment, the integrated structure may take the form of a through mold via (TMV) module having a substrate, at least one component coupled to the substrate and a body encapsulating the at least one component. The integrated structure further includes a flexible printed circuit board (flex-PCB) integrated with the substrate of the TMV module. A via transverses the body to provide a communication pathway external to the body from the substrate.

Another embodiment may take the form of an electronic system including a logic board and at least one module coupled to the logic board. The module includes a flex-PCB substrate, a first component coupled to the flex-PCB substrate, and a resin body encapsulating the at least one component. The resin body has a plurality of communication links between the flex-PCB and the logic board.

Yet another embodiment takes the form of a method of manufacturing a module for interconnection with a logic board. The method includes coupling a component to a flex-PCB and forming a resin body encapsulating the component. The method also includes creating conductive pathways through the resin body.

While multiple embodiments are disclosed, still other embodiments of the present invention will become apparent to those skilled in the art from the following Detailed Description. As will be realized, the embodiments are capable of modifications in various aspects, all without departing from the spirit and scope of the embodiments. Accordingly, the drawings and detailed description are to be regarded as illustrative in nature and not restrictive

DETAILED DESCRIPTION

Electronic devices and systems implementing a structure that allows circuit elements and a component interconnect to reside in the same area on a logic board is described herein. The structure provides a more compact board which can free up more room for battery capacity, new hardware, or advanced form-factors for the electronic devices. The structure and interconnect include an integrated flex-PCB that may improve the connection between components and the logic board and may also simplify the manufacturing process, as there would be fewer processing steps due to the integration of the flex-PCB.

One embodiment may take the form of a TMV module with a flex-PCB integrated into a substrate of the TMV module. Components and/or circuit elements may be contained within the TMV module and mounted to the substrate. In particular, circuit elements that conventionally may be located on the logic board may be included in module. The flex-PCB is directly integrated into the module substrate and, hence, the module incurs no height penalty, while providing equivalent (or improved) connection to the flex-PCB. In some embodiments, the substrate can be a flex-PCB, while in other embodiments the substrate may take the form of a rigid-flex substrate, an embedded-flex ("e-flex") substrate or an electric circuit board ("ECP") substrate, for example.

In some embodiments, the flex-PCB may serve as the substrate. Further, the circuit elements may be mounted to both sides of the substrate or multiple flex-PCBs may be integrated into a single module to form a flex-to-flex component. In still other embodiments, multiple TMV modules with integrated flex-PCBs may be stacked to further take advantage of vertical space above a logic board. The 3D circuit layout using TMVs with the innovation of zero interconnect height penalty enables the next generation of densely packed devices.

Typical TMV modules are constructed in array formats resulting in substrate footprints that are generally rectangular. Conventionally, potting is applied to the entire substrate. In accordance with the present embodiments, only a localized area of a substrate may be potted while the rest of the substrate remains free of resin. This allows the unpotted portion of the substrate to be flexible. The selective potting is generally incompatible with current array processing. Hence, molding techniques used in the fabrication of mechanical components, including injection molding or dam and fill may be implemented. Additionally, special fixture designs may be created to make the module types discussed herein compatible with surface-mount technology (SMT) processes.

Figure 1:
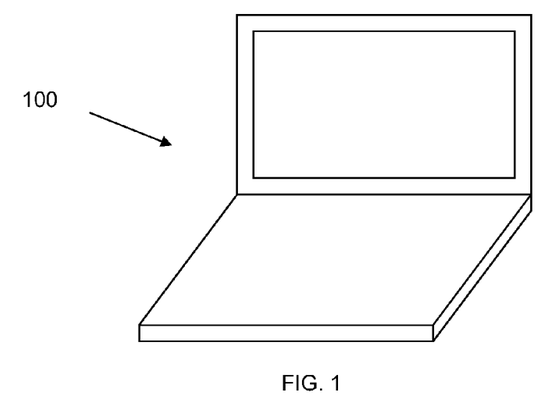
FIG. 1 illustrates an electronic system in which an integrated structure for interconnection of electrical components may be implemented.

Referring to FIG. 1, a notebook computer system 100 is illustrated. The system 100 is provided merely as an example electronic device in which the 3D structures with integrated flex-PCBs may be implemented. It should be appreciated that the 3D structures may be implemented in any suitable device. For example, the 3D structures may be utilized in desktop computers, tablet computers, televisions, cameras and the like.

Figure 2:
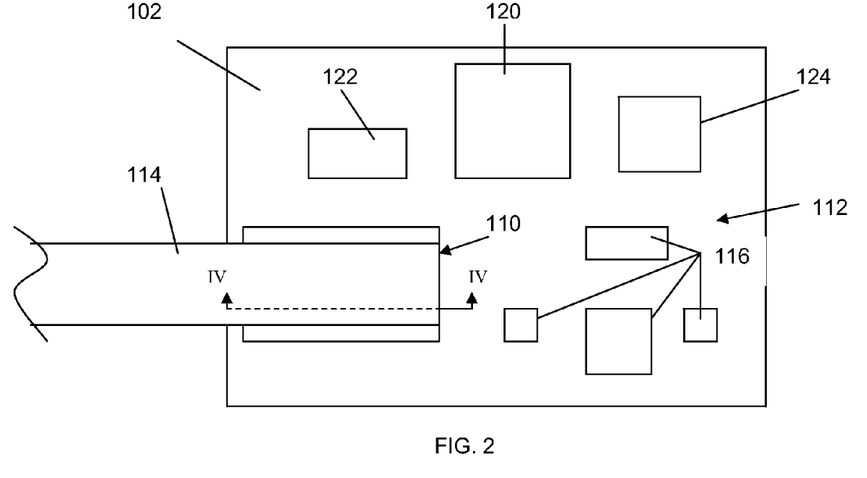
FIG. 2. illustrates a logic board of the system of FIG. 1 having the integrated structure for interconnection.

FIG. 2 illustrates a logic board 102 of the notebook computer system 100 and a module 110 having a flex-PCB 114 integrated with its substrate. The module 110 is coupled to the logic board 102. The logic board 102 may be any circuit board, such as a main logic board. The logic board 102 may have a number of different components 112 coupled to it, such as a processor 120, memory 122, a graphics processor 124, and so forth. Other electrical components 116 may take the form of radio transceivers (e.g., WiFi, Bluetooth, and the like), buttons, switches, I/O ports, and so forth.

Figure 3:
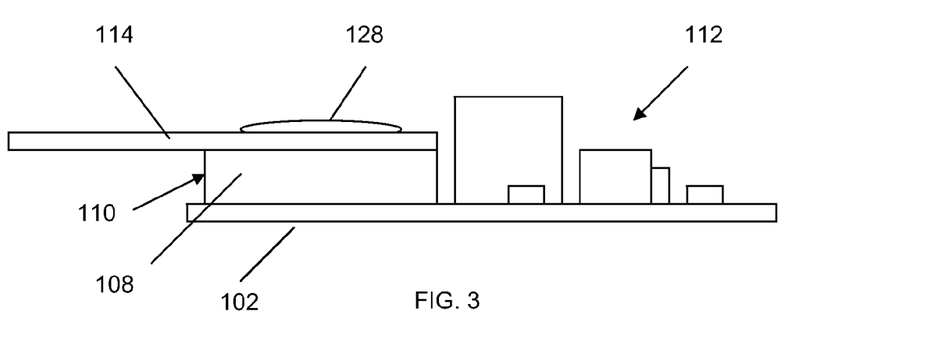
FIG. 3 is a side-view of the logic board of FIG. 2.

FIG. 3 is a side view of the logic board 102 that shows a height of various components on the logic board including the module 110. As shown, the module 110 is not the tallest component on the logic board 110. Rather, there are other components taller than the module 110. As such, the module 110 does not incur a height penalty. The module 110 does not require any further height accommodation relative to the other components.

The module 110 may include a body 108 that may be made of any suitable material, but in one embodiment is made of a resin. Components may be located within the body 108 of the module 110. The module 110 additionally has the flex-PCB 114 coupled thereto. That is, the flex-PCB 114 may be soldered to the module 110. As such, the flex-to-logic board interconnect shares the area on the logic board with other components, thus allowing a more compact logic board design. The soldering of the flex-PCB 114 to the module 110 forms one or more solder bump 128 on the module 110.

Figure 4:
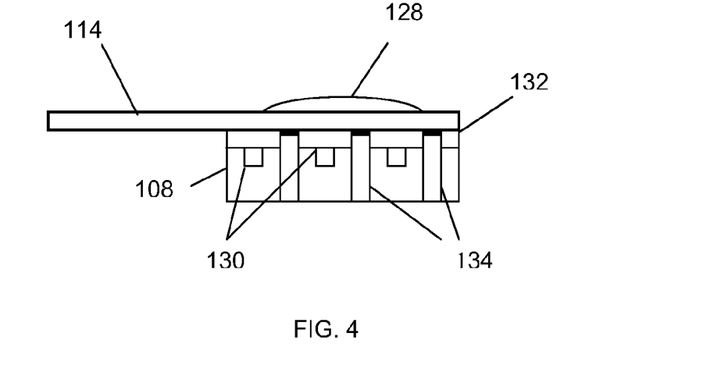
FIG. 4 is a cross-sectional view of the integrated structure of FIG. 2 taken along line IV-IV.

FIG. 4 is a cross-sectional view of the module 110 taken along line IV-IV in FIG. 2. The module 110 may include a number of components 130 coupled to a substrate 132 of the module 110. The components 130 may take the form of capacitors, resistors, inductors, integrated circuits, or any other suitable components. The flex-PCB 114 is also coupled to the substrate 132. The substrate 132 may take the form of a PCB, rigid-flex substrate, an e-flex substrate, an ECB, or any other suitable substrate.

Additionally, conductive members 134 extend from the substrate 132 to an outer surface of the module 110. The conductive members 134 may take the form of vias that are drilled into the body 108 of the module 110 to provide an interconnection between the components of the module and the logic board 102, as well as the flex-PCB 114 to the logic board. As such, the vias may provide a data path. In some embodiments, the vias may be filled with solder while in other embodiments the conductive members 134 may take the form of solid conductive posts, such as copper posts or silver paste. It should be appreciated that any suitable conductive material may be used to provide a connection between the components or flex-cable and the logic board.

Figure 5:
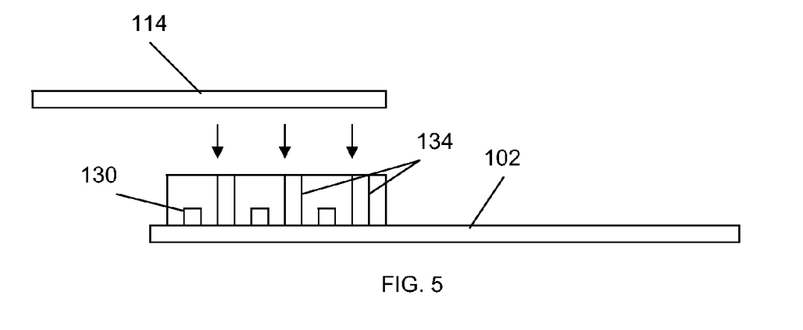
FIG. 5. illustrates an integrated structure with components located on a logic board in accordance with an alternative embodiment.

FIG. 5 illustrates an alternative embodiment wherein the components 130 components 130 and the body 108 of the module 110 are coupled to the logic board 110. Subsequently, holes maybe drilled into the body 108 to form the vias. The holes may be filled with solder or another electrically conductive material and a flex-PCB may be coupled to the body 108. In particular, the flex-PCB 114 may be hand soldered onto the body 108. However, in the event that the conductive members are solder filled vias, the solder may migrate during soldering of the flex-PCB to the body 108.

Figure 6:
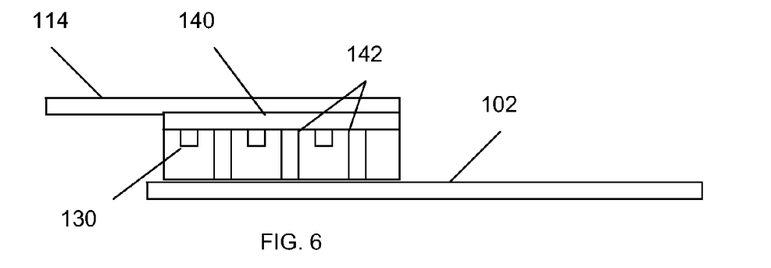
FIG. 6 illustrates another alternative embodiment of an integrated structure.

FIG. 6 illustrates another alternative embodiment wherein a substrate such as a PCB 140 is inverted over the logic board 102 and connected thereto with an electrically conductive material such as copper wires 142. Components 130 are coupled to the PCB 140 and a flex-PCB (not shown) may be coupled to the PCB. A two step process may be implemented during assembly, a first soldering process, such as a reflow process may be used to couple the PCB 140 to the logic board, and a hand solder or hot mar process may be used to couple the flex-PCB 114 to the PCB 140. This two step process provides a better temperature profile over the embodiment shown in FIG. 5. In some embodiments, the copper wires 142 may support the PCB 140 independent of a resin body.

Figure 7:
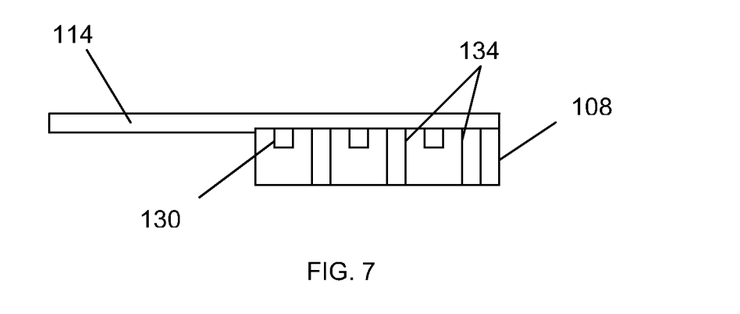
FIG. 7 illustrates yet another alternative embodiment having a flex-PCB serve as a substrate for the integrated structure.

In order to further simplify the manufacturing process and to reduce the size of the module, the flex-PCB may be directly integrated into the module without any other substrate. FIG. 7 illustrates an embodiment where the flex-PCB 114 serves as the substrate for the module 110. As shown in FIG. 7, components are mounted directly to the flex-PCB 114 and no other substrate is provided for the module. Hence, in this embodiment, the height of the module is reduced by eliminating a substrate and by eliminating soldering bumps from soldering the flex-PCB to the substrate. This further reduces assembly steps and simplifies the manufacturing process.

Figure 8:
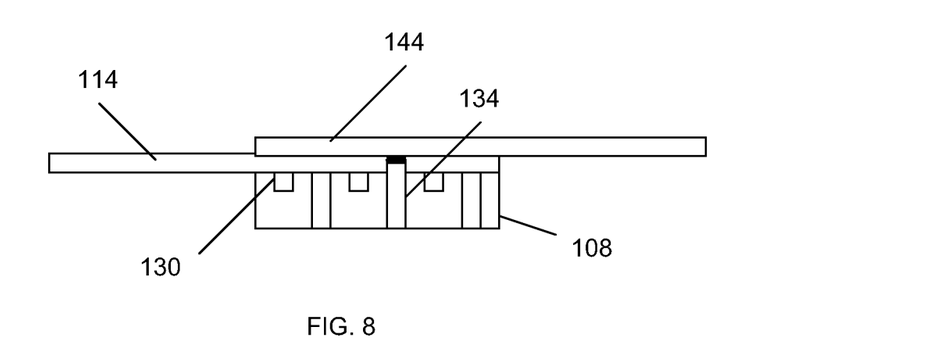
FIG. 8 illustrates an additional flex-PCB coupled to the flex-PCB of FIG. 7 in accordance with another alternative embodiment.

FIG. 8 illustrates an alternative embodiment where multiple flex-PCBs 114, 144 are mounted to each other to form a multi-flex-PCB module or a flex-on-flex structure Vias may be provided that directly couple the second flex-PCB 144 to a logic board. That is, the vias could extend to flex-PCB 144 through flex-PCB 114, thereby allowing power or data routing along either flex-PCB. In these cases, the traces of the flex-PCB 114 would be routed around the vias. Alternatively, the second flex-PCB may couple to the logic board via the first flex-PCB 114.

Figure 9:
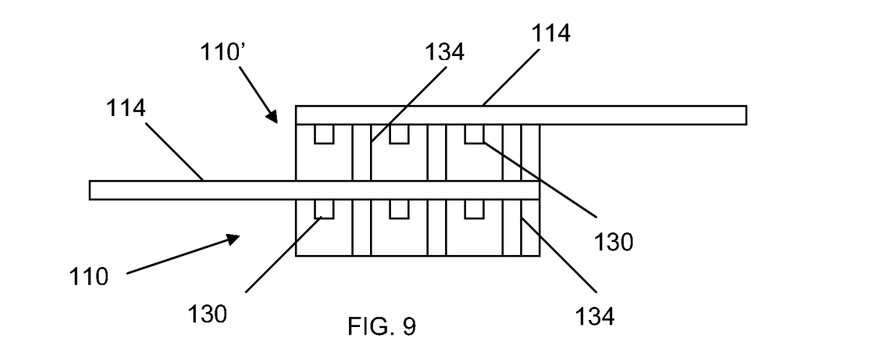
FIG. 9 illustrates two stacked integrated structures each having a flex-PCB serve as a substrate for the respective integrated structures in accordance with still another alternative embodiment.

FIG. 9 illustrates multiple modules 110, 110' being stacked on each other with each module having an integrated flex-PCB 114, vias 134 and components 130, in accordance with an alternative embodiment. In one embodiment, vias 134 may be formed to directly couple the second flex-PCB 110' with a logic board. That is, the vias 134 may extend from the second flex-PCB 110' to flush with a lower surface of the first module 110. In other embodiments, vias of the second module 110' may simply couple to the first flex-PCB 114 which may provide a pass through connection. As may be appreciated, multiple flex-PCBs on in one module may provide significant surface area savings on logic boards.

In some embodiments, power and/or data from both flex-PCBs 114 may be provided through one or more vias. That is, for example, one via may power both flex-PCBs. All power may be provided from a top flex-PCB 114 in some embodiments. In other embodiments, every other via may be configured to couple the top flex-PCB with a logic board, while other vias couple a lower flex-PCB to the logic board. Thus, the lower module 110 may be electrically isolated from the top module 110'.

It should be appreciated that because nets can be shared or pass directly flex-to-flex, the total number of nets going into the MLB can be reduced/optimized, resulting in lower interconnect area. For example, the nets may be shared between the logic board (e.g., a main logic board) and the modules (e.g., one or more stacked modules), the nets may pass through from the logic board to only one flex (e.g., nets that just pass through one flex to reach another flex), or nets may connect from one flex to the other without involving the logic board. As such, efficient use of the area on a logic board as well, as the space above the logic board, may be achieved.

Figure 10:
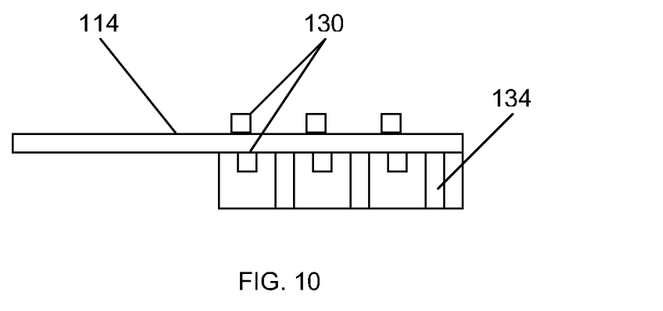
FIG. 10 illustrates components being located on both sides of a flex-PCB in accordance with another alternative embodiment.

In FIG. 10, components are mounted on both sides of the flex-PCB, thereby freeing up more space on the surface of the logic board. In one embodiment, components on a single side are encapsulated within the body forming resin. In other embodiments, all components are encapsulated by the body forming resin (e.g., components on both sides of the flex-PCB). In still other embodiments, less than all the components on one side of the flex-PCB are encapsulated within the resin. Additionally, as may be appreciated, an additional module may be provided on top of the module shown in FIG. 10.

A distributed module may also be provided. That is, with the aforementioned arrangements and proper via positioning, a module may be divided into two or more sub-modules that communicate with each other, even though they're on different flexes, opposing sides of a flex-PCB or even on physically separate module (e.g., a stacked module). The distributed module may provide increased component density and/or may accommodate unique form factor designs for electronic devices.

Figure 11:
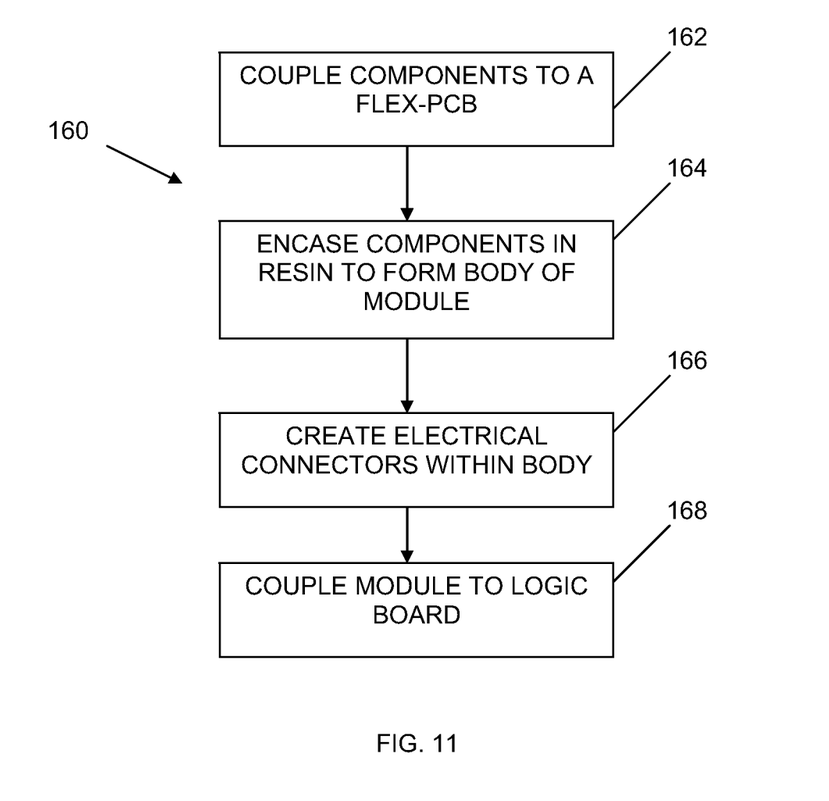
FIG. 11 is a flowchart illustrating a method of manufacturing an integrated structure for interconnecting a flex-PCB with a logic board.

FIG. 11 is a flowchart illustrating a method 160 of manufacturing a logic board with a module having an integrated flex-PCB. Initially, the module 110 may be created by coupling components to the flex-PCB (Block 162). The body of the module 110 is formed, for example through a potting process (Block 164). Electrical connectors are provided within the body (Block 166). The module is coupled to the logic board (Block 168).

In some embodiments, the forming of the body of the module may include a resin potting process. The potting process may be modified so that some of the flex-PCB remains free of the resin, thereby allowing the flex-PCB to be flexible. In some embodiments, a molding process such as injection molding or dam and fill may be implemented to better control the forming of the body and allowing more complicated shapes and/or contours to be formed in the body. Hence, it should be appreciated that the modules may take any particular shape compatible with a specific design and are not limited to generally square, rectangular or otherwise generally uniformly formed shapes. Rather, the modules may take forms that conform to particular size and shape constraints and, further, may be configured to facilitate certain processes such as SMT to simplify and/or speed the manufacturing process.

The base substrate is a flex (or rigid-flex, e-flex, and so forth), which during the initial process step goes through standard SMT processes (e.g., solder printing, pick&place, reflow, underfill or the like) before potting and TMV creation. When attaching a finished module to the logic board the solder can be printed on the logic board, the module is then pick&placed, and reflowed. This method of solder only on logic boards (e.g., with the TMVs not having additional solder) is similar to land grid array packages which have no solder. Solder may be applied to the TMV and reflowed to create a solder bump (similar to ball grid array) using robotic solder, jet solder, or screenprint for example. Additionally, solder-filled TMVs may be overfilled to create a bump (e.g., the side of the TMV that is to be soldered to the logic board may not be flush, but instead proud).

The flex modules may have special support during SMT processing to stabilize the modules and help ensure proper processing of the modules. Depending on the shape, weight, and weight distribution of the modules which may cause the module to tip during SMT, support structures may be provided to prevent tipping. In some embodiments, adhesives may be used to secure the position of the modules. In other embodiments, SMT carrier fixtures may have a variety of supports in place for the module (e.g., support pins/features, clamping mechanisms, and the like) to help stabilize the module and prevent the module from tipping during SMT processing.

The foregoing describes some example embodiments of 3D circuit and interconnect topologies. Although the foregoing discussion has presented specific embodiments, persons skilled in the art will recognize that changes may be made in form and detail without departing from the spirit and scope of the embodiments. Accordingly, the specific embodiments described herein should be understood as examples and not limiting the scope thereof.

The invention claimed is:

1. An integrated structure, comprising:
a logic board;
a plurality of integrated circuits mounted on or in the logic board;
a through mold via (TMV) module mounted on or in the logic board, the TMV module comprising:
a substrate;
at least one component coupled to the substrate;
a body encapsulating the at least one component; and
one or more vias that extend all of the way through the substrate and the body; and
a flexible printed circuit board (flex-PCB) directly coupled to the substrate of the TMV module, wherein the one or more vias provide an interconnection between the at least one component, the flexible printed circuit board, and at least some of the integrated circuits in the plurality of integrated circuits.

2. The integrated structure of claim 1 further comprising at least one component on each side of the flex-PCB.

3. The integrated structure of claim 1 further comprising a second flex-PCB coupled to the flex-PCB to form a flex-on-flex structure.

4. The integrated structure of claim 1 further comprising:
   a second TMV module coupled to the TMV module and comprising a second substrate; and
   a second flex-PCB directly coupled to the second substrate of the second TMV module, wherein a TMV is provided to communicatively couple second substrate with the TMV module.

5. The integrated structure of claim 1, wherein the substrate comprises one of a rigid-flex or an embedded-flex (e-flex) printed circuit board and the flex-PCB is soldered thereto.

6. The integrated structure of claim 1, wherein the body comprises a resin material potted about the substrate.

7. The integrated structure of claim 6, wherein only a portion of the substrate is potted in the resin.

8. The integrated structure of claim 1, wherein the substrate comprises an inverted PCB.

9. The integrated structure of claim 1, wherein the one or more vias are filled with solder, silver paste, or plated with a conductive material or comprise metal structures that extend from the substrate and are exposed externally from the module.

10. The integrated structure of claim 1, wherein the flex-PCB is soldered to the substrate.

11. The integrated structure of claim 1 wherein the at least one component comprises a capacitor.

12. The integrated structure of claim 1 wherein the at least one component comprises an inductor.

13. The integrated structure of claim 1 wherein the at least one component comprises an integrated circuit.

14. The integrated structure of claim 1 wherein the at least one component comprises a resistor.

* * * * *